United States Patent
Hayashi

(10) Patent No.: US 10,351,466 B2
(45) Date of Patent: Jul. 16, 2019

(54) GLASS

(71) Applicant: Nippon Electric Glass Co., Ltd., Shiga (JP)

(72) Inventor: Masahiro Hayashi, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 0 days.

(21) Appl. No.: 15/576,983

(22) PCT Filed: May 24, 2016

(86) PCT No.: PCT/JP2016/065243
§ 371 (c)(1),
(2) Date: Nov. 27, 2017

(87) PCT Pub. No.: WO2016/194693
PCT Pub. Date: Dec. 8, 2016

(65) Prior Publication Data
US 2018/0148367 A1 May 31, 2018

(30) Foreign Application Priority Data

Jun. 2, 2015 (JP) .................................. 2015-112004

(51) Int. Cl.
*C03C 3/087* (2006.01)
*C03C 3/091* (2006.01)
*C03C 3/097* (2006.01)
*H01L 51/50* (2006.01)
*G02F 1/1333* (2006.01)
*H01L 27/32* (2006.01)

(52) U.S. Cl.
CPC .............. *C03C 3/087* (2013.01); *C03C 3/091* (2013.01); *C03C 3/097* (2013.01); *G02F 1/1333* (2013.01); *H01L 27/32* (2013.01); *H01L 51/50* (2013.01); *G02F 2001/133302* (2013.01)

(58) Field of Classification Search
CPC .......... C03C 3/085; C03C 3/087; C03C 3/097
See application file for complete search history.

(56) References Cited

U.S. PATENT DOCUMENTS

| 2012/0282450 A1* | 11/2012 | Kawaguchi ............. C03C 3/093 428/220 |
| 2013/0029830 A1 | 1/2013 | Koyama et al. |
| 2014/0049708 A1* | 2/2014 | Murata ................... C03C 3/087 349/15 |
| 2014/0249019 A1 | 9/2014 | Koyama et al. |

FOREIGN PATENT DOCUMENTS

| DE | 19851927 | * | 2/2000 | |
| EP | 2 351 716 | | 8/2011 | |
| JP | 1-126239 | | 5/1989 | |
| JP | 2002003240 A | * | 1/2002 | ............ C03C 3/091 |
| JP | 2010-215463 | | 9/2010 | |
| JP | 2012121738 A | * | 6/2012 | |
| JP | 2012-184146 | | 9/2012 | |
| JP | 2012-236759 | | 12/2012 | |
| JP | 2013-216561 | | 10/2013 | |
| JP | 2013-230963 | | 11/2013 | |
| WO | 2010/029967 | | 3/2010 | |

OTHER PUBLICATIONS

Machine Translation of JP 2010215463, Sep. 2010. (Year: 2010).*
International Search Report dated Jul. 12, 2016 in International (PCT) Application No. PCT/JP2016/065243.
International Preliminary Report on Patentability dated Dec. 5, 2017 in International (PCT) Application No. PCT/JP2016/065243.

* cited by examiner

*Primary Examiner* — Karl E Group
(74) *Attorney, Agent, or Firm* — Wenderoth, Lind & Ponack, L.L.P.

(57) ABSTRACT

A glass of the present invention includes as a glass composition, in terms of mass %, 50% to 65% of $SiO_2$, 15% to 26% of $Al_2O_3$, 0% to 5% of $B_2O_3$, 0% to 5% of MgO, 0% to 10% of CaO, 0% to 10% of SrO, 0% to 15% of BaO, and 0.01% to 15% of $P_2O_5$, has a molar ratio (MgO+CaO+SrO+BaO)/$Al_2O_3$ of from 0.5 to 1.5, and satisfies a relationship of $\{[B_2O_3]+3\times[P_2O_5]\} \leq 18.5$ mol %.

11 Claims, No Drawings

US 10,351,466 B2

GLASS

TECHNICAL FIELD

The present invention relates to a glass, and more specifically, to a glass suitable as a substrate for an OLED display or a liquid crystal display. More particularly, the present invention relates to a glass suitable as a substrate for a display driven by an oxide TFT or a low-temperature p-Si.TFT (LTPS).

BACKGROUND ART

A glass has hitherto been widely used as a substrate for a flat panel display, such as a liquid crystal display, a hard disk, a filter, a sensor, or the like. In recent years, in addition to a conventional liquid crystal display, an OLED display has been actively developed by virtue of its self-luminescence, high color reproducibility, wide viewing angle, high-speed response, high definition, and the like. Some of the developed OLED displays have already been put to practical use.

Meanwhile, a liquid crystal display or an OLED display for a mobile device, such as a smartphone, requires a screen with ultra-high definition because the display has a small area but needs to display a lot of information. The display also requires high-speed response because a moving image is displayed thereon.

In such application, an OLED display or a liquid crystal display driven by a LTPS is suitable. The OLED display emits light when a current flows through an OLED element serving as a constituent of a pixel. Therefore, a material exhibiting low resistance and a high electron mobility is used as a drive TFT element. As such material, an oxide TFT formed typically of indium gallium zinc oxide (IGZO) has attracted attention, aside from the above-mentioned LTPS. The oxide TFT has low resistance and a high mobility, and can be formed at relatively low temperature. The conventional p-Si.TFT, in particular the LTPS, is liable to have variations in TFT characteristics upon its formation on a large-size glass substrate, owing to instability of an excimer laser to be used in polycrystallization of an amorphous Si (a-Si) film. Therefore, in a TV application or the like, display unevenness is liable to occur in a screen. In contrast, the oxide TFT is excellent in homogeneity of TFT characteristics upon its formation on a large-size glass substrate. Therefore, the oxide TFT has attracted attention as a potential TFT formation material, and some of the oxide TFTs have already been put to practical use.

CITATION LIST

Patent Literature 1: JP 2013-216561 A

SUMMARY OF INVENTION

Technical Problem

Meanwhile, in general, chemical etching is employed in order to reduce the thickness of the display. This method involves immersing a display panel obtained by bonding two glass substrates in a hydrofluoric acid (HF)-based chemical to reduce the thicknesses of the glass substrates.

However, related-art glass substrates have a problem of a significantly low etching rate owing to high resistance to the HF-based chemical. When the concentration of HF in the chemical is increased in order to increase the etching rate, insoluble fine particles are increased in the HF-based solution. As a result, the fine particles are liable to adhere to a glass surface, and etching uniformity is impaired on the surface of the glass substrate.

In order to solve the above-mentioned problem, there has been an investigation into a method of increasing the etching rate in the HF-based chemical by reducing the content of $SiO_2$ in a glass composition (see Patent Literature 1). However, when the content of $SiO_2$ is reduced in the glass composition, HCl resistance and a strain point are liable to lower.

When the glass substrate has low HCl resistance, white turbidity is liable to occur in the glass substrate or a reaction product is liable to adhere onto a glass surface in a step of, after forming a metal film for wiring or the like on the glass substrate, removing the unnecessary metal film with a HCl aqueous solution.

When the glass substrate has a low strain point, thermal shrinkage of the glass substrate increases in a production process of a p-Si.TFT, and pattern distortion is liable to occur.

The present invention has been made in view of the above-mentioned circumstances, and a technical object of the present invention is to devise a glass which has a higher etching rate in a HF-based chemical than the related-art glass and has high HCl resistance and a high strain point.

Solution to Problem

The inventor of the present invention has repeatedly performed various experiments, and as a result, has found that the above-mentioned technical object can be achieved by strictly restricting the range of the glass composition of a $SiO_2$—$Al_2O_3$—$B_2O_3$—RO (RO represents an alkaline earth metal oxide)-based glass. Thus, the finding is proposed as the present invention. That is, a glass according to one embodiment of the present invention comprises as a glass composition, in terms of mass %, 50% to 65% of $SiO_2$, 15% to 26% of $Al_2O_3$, 0% to 5% of $B_2O_3$, 0% to 5% of MgO, 0% to 10% of CaO, 0% to 10% of SrO, 0% to 15% of BaO, and 0.01% to 15% of $P_2O_5$, has a molar ratio (MgO+CaO+SrO+BaO)/$Al_2O_3$ of from 0.5 to 1.5, and satisfies a relationship of $\{[B_2O_3]+3\times[P_2O_5]\}\leq 18.5$ mol %. Herein, the "MgO+CaO+SrO+BaO" refers to the total content of MgO, CaO, SrO, and BaO. The "(MgO+CaO+SrO+BaO)/$Al_2O_3$" refers to a value obtained by dividing the total content of MgO, CaO, SrO, and BaO by the content of $Al_2O_3$. The "[$B_2O_3$]" refers to the content of $B_2O_3$. The "[$P_2O_5$]" refers to the content of $P_2O_5$. The "$\{[B_2O_3]+3\times[P_2O_5]\}$" refers to the total amount of the content of $B_2O_3$ and three times the content of $P_2O_5$.

The glass according to the embodiment of the present invention achieves an increase in etching rate by restricting the content of $SiO_2$ to 65 mass % or less. Meanwhile, when the content of $SiO_2$ is reduced, HCl resistance and a strain point are liable to lower. In view of the foregoing, in the present invention, the value $\{[B_2O_3]+3\times[P_2O_5]\}$ is restricted to 18.5 mol % or less to increase the HCl resistance, and the content of $B_2O_3$ is restricted to 5 mass % or less to increase the strain point.

Further, when the contents of $SiO_2$ and $B_2O_3$ are reduced in the glass composition, devitrification resistance is liable to lower. In view of the foregoing, in the present invention, $P_2O_5$ is introduced as an essential component in the glass composition at a content of 0.01 mass % or more. With this, the devitrification resistance can be increased. Specifically, a liquidus temperature for a $SiO_2$—$Al_2O_3$—CaO-based crystal (particularly, anorthite) and a liquidus temperature for a SiO$_2$—Al$_2$O$_3$-based crystal (particularly, mullite) can be reduced. The "-based crystal" refers to a crystal formed of the explicit component(s).

Secondly, it is preferred that the glass according to the embodiment of the present invention have a mass ratio (SiO$_2$+B$_2$O$_3$)/Al$_2$O$_3$ of from 2 to 4. Herein, the "(SiO$_2$+B$_2$O$_3$)/Al$_2$O$_3$" refers to a value obtained by dividing the total content of SiO$_2$ and B$_2$O$_3$ by the content of Al$_2$O$_3$.

Thirdly, it is preferred that the glass according to the embodiment of the present invention have a mass ratio B$_2$O$_3$/P$_2$O$_5$ of 2 or less. Herein, the "B$_2$O$_3$+P$_2$O$_5$" refers to a value obtained by dividing the content of B$_2$O$_3$ by the content of P$_2$O$_5$.

Fourthly, it is preferred that the glass according to the embodiment of the present invention satisfy a relationship of 4 mol %≤{[B$_2$O$_3$]+3×[P$_2$O$_5$]}≤16.5 mol % and a relationship of 110 mol %≤{2×[SiO$_2$]—[MgO]—[CaO]—[SrO]—[BaO]}≤130 mol %. Herein, the "[SiO$_2$]" refers to the content of SiO$_2$, the "[MgO]" refers to the content of MgO, the "[CaO]" refers to the content of CaO, the "[SrO]" refers to the content of SrO, and the "[BaO]" refers to the content of BaO. The "{2×[SiO$_2$]—[MgO]—[CaO]—[SrO]—[BaO]}" refers to a content obtained by subtracting the total content of MgO, CaO, SrO, and BaO from twice the content of SiO$_2$.

Fifthly, it is preferred that the glass according to the embodiment of the present invention have a content of Li$_2$O+Na$_2$O+K$_2$O of 0.5 mass % or less in the glass composition. With this, a situation in which an alkali ion is diffused during heat treatment into a semiconductor film and causes degradation in the characteristics of the film is easily prevented. Herein, the "content of Li$_2$O+Na$_2$O+K$_2$O" refers to the total content of Li$_2$O, Na$_2$O, and K$_2$O.

Sixthly, it is preferred that the glass according to the embodiment of the present invention have a content of B$_2$O$_3$ of 3.0 mass % or less in the glass composition.

Seventhly, it is preferred that the glass according to the embodiment of the present invention have a property of allowing precipitation of two or more kinds of crystals among a SiO$_2$—Al$_2$O$_3$—RO-based crystal, a SiO$_2$-based crystal, and a SiO$_2$—Al$_2$O$_3$-based crystal when being retained in a temperature range of from a liquidus temperature to (liquidus temperature−50° C.) for 24 hours. Herein, the "liquidus temperature" refers to a temperature at which devitrification (crystalline foreign matter) is observed in glass when glass powder which has passed through a standard 30-mesh sieve (500 μm) and remained on a 50-mesh sieve (300 μm) is placed in a platinum boat and kept for 24 hours in a gradient heating furnace set to from 1,100° C. to 1,350° C., followed by taking the platinum boat out of the gradient heating furnace.

Eighthly, it is preferred that the glass according to the embodiment of the present invention have a strain point of 710° C. or more. Herein, the "strain point" refers to a value measured by a method in accordance with ASTM C336.

Ninthly, it is preferred that the glass according to the embodiment of the present invention have an etching depth of 25 μm or more when immersed in a 10 mass % HF aqueous solution at 20° C. for 30 minutes.

Tenthly, it is preferred that the glass according to the embodiment of the present invention have a specific Young's modulus of 28 GPa/(g/cm$^3$) or more. Herein, the "specific Young's modulus" refers to a value obtained by dividing a Young's modulus by a density, and the "Young's modulus" refers to a value measured by a dynamic elastic modulus measurement method (resonance method) in accordance with JIS R1602.

Eleventhly, it is preferred that the glass according to the embodiment of the present invention be used for a substrate for a liquid crystal display.

Twelfthly, it is preferred that the glass according to the embodiment of the present invention be used for a substrate for an OLED display.

Thirteenthly, it is preferred that the glass according to the embodiment of the present invention be used for a substrate for a high-definition display driven by a polysilicon or oxide TFT.

Fourteenthly, a glass according to one embodiment of the present invention comprises as a glass composition at least SiO$_2$, Al$_2$O$_3$, B$_2$O$_3$, P$_2$O$_5$, and RO, satisfies a relationship of {[B$_2$O$_3$]+3×[P$_2$O$_5$]}≤18.5 mol %, and has a property of allowing precipitation of two or more kinds of crystals among a SiO$_2$—Al$_2$O$_3$—RO-based crystal, a SiO$_2$-based crystal, and a SiO$_2$—Al$_2$O$_3$-based crystal when being retained in a temperature range of from a liquidus temperature to (liquidus temperature−50° C.) for 24 hours.

DESCRIPTION OF EMBODIMENTS

A glass of the present invention comprises as a glass composition, in terms of mass %, 50% to 65% of SiO$_2$, 15% to 26% of Al$_2$O$_3$, 0% to 5% of B$_2$O$_3$, 0% to 5% of MgO, 0% to 10% of CaO, 0% to 10% of SrO, 0% to 15% of BaO, and 0.01% to 15% of P$_2$O$_5$, has a molar ratio (MgO+CaO+SrO+BaO)/Al$_2$O$_3$ of from 0.5 to 1.5, and satisfies a relationship of {[B$_2$O$_3$]+3×[P$_2$O$_5$]}≤18.5 mol %. The reasons why the contents of the components are restricted as described above are hereinafter described.

When the content of SiO$_2$ is too small, chemical resistance, particularly HCl resistance, is liable to lower, and a strain point is liable to lower. In addition, it becomes difficult to achieve a reduction in density. Further, it becomes difficult to allow two or more kinds of crystals to precipitate as a primary phase. Meanwhile, when the content of SiO$_2$ is too large, it becomes difficult to increase an etching rate. In addition, meltability is liable to lower owing to a high viscosity at high temperature. Further, a SiO$_2$-based crystal, particularly cristobalite, precipitates, and a liquidus viscosity is liable to lower. Thus, the upper limit content of SiO$_2$ is preferably 65 mass %, 63 mass %, or 61 mass %, particularly preferably 60 mass %, and the lower limit content of SiO$_2$ is preferably 50 mass %, 52 mass %, 53 mass %, 54 mass %, or 55 mass %, particularly preferably 56 mass %. The content most preferably falls within a range of from 56 mass % to 60 mass %.

When the content of Al$_2$O$_3$ is too small, the strain point lowers, a thermal shrinkage ratio becomes higher, a Young's modulus lowers, and a glass substrate is liable to be deflected. In contrast, when the content of Al$_2$O$_3$ is too large, buffered hydrofluoric acid (BHF) resistance lowers and white turbidity is liable to occur in the surface of the glass. In addition, crack resistance is liable to lower. Further, a SiO$_2$—Al$_2$O$_3$-based crystal, particularly mullite, precipitates in the glass, and the liquidus viscosity is liable to lower. The upper limit content of Al$_2$O$_3$ is preferably 26 mass %, 25 mass %, 24 mass %, or 23 mass %, particularly preferably 22 mass %, and the lower limit content of Al$_2$O$_3$ is preferably 15 mass %, 16 mass %, or 17 mass %, particularly preferably 18 mass %. The content most preferably falls within a range of from 18 mass % to 22 mass %.

B$_2$O$_3$ is a component that acts as a melting accelerate component, and lowers the viscosity at high temperature and enhances the meltability. The content of B$_2$O$_3$ is preferably from 0 mass % to 5 mass %, from 0 mass % to 4 mass %, from 0 mass % to 3 mass %, from 0 mass % to 2.5 mass %, from 0 mass % to 2 mass %, from 0 mass % to 1.5 mass %, or from 0 mass % to 1 mass %, particularly preferably from 0 mass % to 0.5 mass %. When the content of $B_2O_3$ is too small, $B_2O_3$ does not act sufficiently as a melting accelerate component, and the BHF resistance and the crack resistance are liable to lower. In addition, a liquidus temperature is liable to increase. In contrast, when the content of $B_2O_3$ is too large, the strain point and the HCl resistance are liable to lower. In addition, the Young's modulus lowers, and the deflection amount of the glass substrate is liable to increase.

The mass ratio $(SiO_2+B_2O_3)/Al_2O_3$ is preferably from 2 to 4 or from 2.1 to 3.6, particularly preferably from 2.2 to 3. When the mass ratio $(SiO_2+B_2O_3)/Al_2O_3$ is outside the range, the devitrification resistance is liable to lower.

$P_2O_5$ is a component that reduces a liquidus temperature for a $SiO_2$—$Al_2O_3$—CaO-based crystal, a liquidus temperature for a $SiO_2$—$Al_2O_3$—BaO-based crystal, and the liquidus temperature for the $SiO_2$—$Al_2O_3$-based crystal. In particular, $P_2O_5$ has a remarkable effect of reducing the liquidus temperature for the $SiO_2$—$Al_2O_3$—BaO-based crystal. Therefore, when $P_2O_5$ is added, those crystals are difficult to precipitate when the content of $SiO_2$ is reduced, and two or more kinds of crystals easily precipitate as primary phases. Further, the liquidus temperature at the time of precipitation of the two or more kinds of crystals as the primary phases is easily reduced. However, when $P_2O_5$ is introduced in a large amount, the glass is liable to undergo phase separation. Therefore, the content of $P_2O_5$ is preferably from 0.01 mass % to 15 mass %, from 0.1 mass % to 12 mass %, from 1 mass % to 11 mass %, from 3 mass % to 10 mass %, or from 4 mass % to 9 mass %, particularly preferably from 5 mass % to 8 mass %.

When the value $\{[B_2O_3]+3\times[P_2O_5]\}$ is restricted within a predetermined range, the HCl resistance and the devitrification resistance are easily balanced. When the value $\{[B_2O_3]+3\times[P_2O_5]\}$ is too small, the devitrification resistance is liable to lower. Meanwhile, when the value $\{[B_2O_3]+3\times[P_2O_5]\}$ is too large, the glass undergoes phase separation, and the HCl resistance is liable to lower. The upper limit value of $\{[B_2O_3]+3\times[P_2O_5]\}$ is preferably 18.5 mol %, 16 mol %, 14 mol %, or 12 mol %, particularly preferably 10 mol %, and the lower limit content of $\{[B_2O_3]+3\times[P_2O_5]\}$ is preferably 1 mol %, 2 mol %, 3 mol %, 4 mol %, or 5 mol %, particularly preferably 6 mol %.

The mass ratio $B_2O_3/P_2O_5$ is preferably 2 or less, 1 or less, or from 0.01 to 0.5, particularly preferably from 0.03 to 0.3. When the mass ratio $B_2O_3/P_2O_5$ is too large, it becomes difficult to increase the HCl resistance while maintaining the devitrification resistance.

When the value $\{[Al_2O_3]+2\times[P_2O_5]\}$ is restricted to a predetermined value or more, the strain point is easily increased even when the content of $SiO_2$ is small. Therefore, the value $\{[Al_2O_3]+2\times[P_2O_5]\}$ is preferably 20 mass % or more, 23 mass % or more, 26 mass % or more, or 28 mass % or more, particularly preferably 30 mass % or more. The "$\{[Al_2O_3]+2\times[P_2O_5]\}$" refers to the total amount of the content of $Al_2O_3$ and twice the content of $P_2O_5$.

MgO is a component that enhances the meltability by lowering the viscosity at high temperature without lowering the strain point. In addition, MgO is most effective in reducing the density among ROs. However, when MgO is introduced in an excessive amount, a $SiO_2$-based crystal, particularly cristobalite, precipitates, and the liquidus viscosity is liable to lower. Further, MgO is a component that is susceptible to a reaction with BHF to form a product. There is a risk in that the reaction product may cause white turbidity in an element on the surface of the glass substrate or in the glass substrate through fixation onto the element or adhesion onto the glass substrate. Further, there is a risk in that colored impurities, such as $Fe_2O_3$, are mixed in the glass from introduction raw materials, such as dolomite, and thus the transmittance of the glass substrate is reduced. Therefore, the content of MgO is preferably from 0 mass % to 5 mass %, from 0.1 mass % to 4.5 mass %, from 0.3 mass % to 4 mass %, or from 0.5 mass % to 3.5 mass %, particularly preferably from 1 mass % to 3 mass %.

As with MgO, CaO is a component that enhances the meltability by lowering the viscosity at high temperature without lowering the strain point. However, when the content of CaO is too large, a $SiO_2$—$Al_2O_3$—RO-based crystal, particularly anorthite, precipitates, and the liquidus viscosity is liable to lower. In addition, the BHF resistance is liable to lower. Therefore, the upper limit content of CaO is preferably 10 mass %, 8 mass %, 7 mass %, or 6 mass %, particularly preferably 6.5 mass %, and the lower limit content of CaO is preferably 0 mass %, 1 mass %, 2 mass %, 3 mass %, or 4 mass %, particularly preferably 4.5 mass %. The content most preferably falls within a range of from 4.5 mass % to 6.5 mass %.

SrO is a component that enhances the chemical resistance and the devitrification resistance. However, when the ratio of SrO in all the ROs is too high, the meltability is liable to lower, and the density and a thermal expansion coefficient are liable to increase. Therefore, the content of SrO is preferably from 0 mass % to 10 mass %, from 0 mass % to 7 mass %, from 0 mass % to 4 mass %, or from 0.1 mass % to 3 mass %, particularly preferably from 0.5 mass % to 2 mass %.

BaO is a component that enhances the HCl resistance and the devitrification resistance. However, when the content of BaO is too large, the density is liable to increase. Therefore, the content of BaO is preferably from 0 mass % to 15 mass %, from 1 mass % to 14 mass %, from 3 mass % to 13 mass %, from 4 mass % to 12 mass %, or from 5 mass % to 11.5 mass %, particularly preferably from 6 mass % to 10.5 mass %.

SrO and BaO each have the property of enhancing the crack resistance, as compared to CaO. Therefore, the content of SrO+BaO (the total content of SrO and BaO) is preferably 2 mass % or more, 3 mass % or more, 4 mass % or more, 5 mass % or more, or 6 mass % or more, particularly preferably more than 7 mass %. However, when the content of SrO+BaO is too large, the density and the thermal expansion coefficient are liable to increase. Therefore, the content of SrO+BaO is preferably 17 mass % or less, 15 mass % or less, 14 mass % or less, 13 mass % or less, 12 mass % or less, or 11 mass % or less, particularly preferably 10 mass % or less.

When two or more kinds (preferably three or more kinds, particularly preferably four or more kinds) of the ROs are mixed and introduced, the liquidus temperature significantly lowers and crystalline foreign matter is hardly generated in the glass, and the meltability and formability are improved.

When the molar ratio $(MgO+CaO+SrO+BaO)/Al_2O_3$ is adjusted within a predetermined range, the liquidus temperature significantly lowers and crystalline foreign matter is less liable to be generated in the glass, and the meltability and the formability are improved. When the molar ratio $(MgO+CaO+SrO+BaO)/Al_2O_3$ is small, the $SiO_2$—$Al_2O_3$-based crystal easily precipitates. Meanwhile, when the molar ratio $(MgO+CaO+SrO+BaO)/Al_2O_3$ is large, the $SiO_2$—$Al_2O_3$—RO-based crystal and the $SiO_2$-based crystal easily precipitate. The upper limit value of the molar ratio (MgO+

CaO+SrO+BaO)/Al$_2$O$_3$ is preferably 1.5, 1.4, 1.3, or 1.2, particularly preferably 1.1, and the lower limit value of the molar ratio (MgO+CaO+SrO+BaO)/Al$_2$O$_3$ is preferably 0.5, 0.6, 0.7, 0.8, or 0.85, particularly preferably 0.9.

When the value {2×[SiO$_2$]—[MgO]—[CaO]—[SrO]—[BaO]} is restricted within a predetermined range, an etching rate in a HF-based chemical is easily optimized. When the value {2×[SiO$_2$]—[MgO]—[CaO]—[SrO]—[BaO]} is too large, the etching rate in a HF-based chemical is reduced improperly. When the value {2×[SiO$_2$]—[MgO]—[CaO]—[SrO]—[BaO]} is too small, the etching rate in a HF-based chemical is increased improperly. In addition, the acceptable introduction amount of Al$_2$O$_3$ is reduced, and it becomes difficult to increase the strain point. The upper limit content of {2×[SiO$_2$]—[MgO]—[CaO]—[SrO]—[BaO]} is preferably 130 mol %, 128 mol %, 126 mol %, 125 mol %, or 124 mol %, particularly preferably 123 mol %, and the lower limit content of {2×[SiO$_2$]—[MgO]—[CaO]—[SrO]—[BaO]} is preferably 110 mol %, 105 mol %, 108 mol %, 110 mol %, or 112 mol %, particularly preferably 115 mol %.

ZnO is a component that improves the meltability and the BHF resistance. However, when the content of ZnO is too large, the glass is liable to be devitrified or the strain point lowers, with the result that it is difficult to secure the heat resistance. Therefore, the content of ZnO is preferably from 0 mass % to 5 mass %, or from 0 mass % to 1 mass %, particularly preferably from 0 mass % to less than 0.1 mass %.

ZrO$_2$ is a component that enhances the HCl resistance. However, when ZrO$_2$ is introduced in a large amount, devitrified stones of ZrSiO$_4$ are liable to be generated. The upper limit content of ZrO$_2$ is preferably 0.5 mass %, 0.2 mass %, or 0.1 mass %, particularly preferably 0.05 mass %. It is preferred to introduce ZrO$_2$ at a content of 0.005 mass % or more from the viewpoint of the HCl resistance. The content most preferably falls within a range of from 0.005 mass % to 0.05 mass %. ZrO$_2$ may be introduced from a raw material or through elution from a refractory.

TiO$_2$ has an effect of enhancing the meltability by lowering the viscosity at high temperature, and also has an effect of enhancing the HCl resistance. However, when TiO$_2$ is introduced in an excessive amount, an ultraviolet light transmittance is liable to lower. The content of TiO$_2$ is preferably 0.5 mass % or less, 0.1 mass % or less, or 0.05 mass % or less, particularly preferably 0.02 mass % or less. When TiO$_2$ is introduced in an extremely small amount (for example, 0.003 mass % or more), an effect of suppressing coloration caused by ultraviolet light is obtained.

SnO$_2$ has a reduction action on bubbles in the glass as a fining agent, and also has an effect of maintaining the ultraviolet light transmittance to a relatively high level when coexisting with Fe$_2$O$_3$ or FeO. However, when the content of SnO$_2$ is too large, devitrified stones of SnO$_2$ are liable to be generated in the glass. The upper limit content of SnO$_2$ is preferably 0.5 mass % or 0.4 mass %, particularly preferably 0.3 mass %, and the lower limit content of SnO$_2$ is preferably 0.01 mass % or 0.05 mass %, particularly preferably 0.1 mass %. The content most preferably falls within a range of from 0.1 mass % to 0.3 mass %.

To the glass of the present invention, SnO$_2$ is preferably added as a fining agent as described above. However, unless the characteristics of the glass are impaired, CeO$_2$, C, and metal powder (for example, Al, Si, or the like) may be added up to 1 mass % instead of or in combination with SnO$_2$.

Also As$_2$O$_3$ and Sb$_2$O$_3$ act effectively as a fining agent. The glass of the present invention does not completely exclude the incorporation of those components, but from an environmental viewpoint, the contents of those components are each preferably less than 0.1 mass % or less than 0.05 mass %, particularly preferably less than 0.01 mass %. In addition, a halogen, such as F or Cl, has an effect of reducing a melting temperature and promoting the action of the fining agent, and as a result, can realize lower melting cost of the glass and a longer life time of a glass production kiln. However, when the content of F or Cl is too large, a metal wiring pattern to be formed on the glass substrate may be corroded in some cases. Therefore, the contents of F and Cl are each preferably 1 mass % or less, 0.5 mass % or less, less than 0.1 mass %, or less than 0.05 mass %, particularly preferably 0.01 mass % or less.

Iron is a component that is mixed in from the raw material as an impurity. When the content of iron is too large, the ultraviolet light transmittance may lower. When the ultraviolet light transmittance lowers, failures may occur in a photolithography step of producing a TFT or in a step of aligning a liquid crystal by using ultraviolet light. Thus, the lower limit content of iron in terms of Fe$_2$O$_3$ is preferably 0.001 mass %, and the upper limit content of iron in terms of Fe$_2$O$_3$ is preferably 0.05 mass %, 0.03 mass %, or 0.02 mass %, particularly preferably 0.01 mass %. The content most preferably falls within a range of from 0.001 mass % to 0.01 mass %.

Cr$_2$O$_3$ is a component that is mixed in from the raw material as an impurity. When the content of Cr$_2$O$_3$ is too large, failures may occur in a foreign matter test for an internal portion of a glass substrate using scattered light from incident light entering from an end surface of the glass substrate, because the light is hard to transmit during the test. Particularly in the case where the substrate has a size measuring 730 mm×920 mm or more, such failures are more liable to occur. In addition, in the case where the glass substrate has a small thickness (for example, 0.5 mm or less or 0.4 mm or less, particularly preferably 0.3 mm or less), the restriction on the content of Cr$_2$O$_3$ is of great significance because the incident light entering from an end surface of the glass substrate is reduced. The upper limit content of Cr$_2$O$_3$ is preferably 0.001 mass %, 0.0008 mass %, 0.0006 mass %, or 0.0005 mass %, particularly preferably 0.0003 mass %, and the lower limit content of Cr$_2$O$_3$ is preferably 0.00001 mass %. The content most preferably falls within a range of from 0.00001 mass % to 0.0003 mass %.

In the case where the glass contains SnO$_2$, the glass is liable to be colored when the content of Rh$_2$O$_3$ is too large. Rh$_2$O$_3$ may be mixed in from a manufacturing vessel made of platinum. The content of Rh$_2$O$_3$ is preferably from 0 mass % to 0.0005 mass %, more preferably from 0.00001 mass % to 0.0001 mass %.

SO$_3$ is a component that is mixed in from the raw material as an impurity. When the content of SO$_3$ is too large, bubbles called reboil are generated during melting and forming, and defects may occur in the glass. The upper limit content of SO$_3$ is preferably 0.005 mass %, 0.003 mass %, or 0.002 mass %, particularly preferably 0.001 mass %, and the lower limit content of SO$_3$ is preferably 0.0001 mass %. The content most preferably falls within a range of from 0.0001 mass % to 0.001 mass %.

Alkaline components, particularly Li$_2$O, Na$_2$O, and K$_2$O, are each a component that degrades characteristics of various films or semiconductor devices formed on the glass substrate. Therefore, it is preferred that the upper limit content of Li$_2$O+Na$_2$O+K$_2$O be reduced to 0.5 mass % (desirably 0.4 mass %, 0.3 mass %, or 0.2 mass %, particularly desirably 0.1 mass %). Meanwhile, when electric melting is performed, the alkaline component is preferably contained in a small amount to increase the electrical conductivity of molten glass. The lower limit content of $Li_2O+Na_2O+K_2O$ is restricted to preferably 0.001 mass % or 0.005 mass %, particularly preferably 0.01 mass %. The content of $Li_2O+Na_2O+K_2O$ most preferably falls within a range of from 0.01 mass % to 0.1 mass %. The content of $Li_2O$ is particularly preferably from 0.0001 mass % to 0.005 mass %. The content of $Na_2O$ is particularly preferably from 0.01 mass % to 0.03 mass %. The content of $K_2O$ is particularly preferably from 0.001 mass % to 0.01 mass %.

Components other than the above-mentioned components may be introduced. The introduction amount thereof is preferably 5 mass % or less or 3 mass % or less, particularly preferably 1 mass % or less.

It is preferred that the glass of the present invention have a property of allowing precipitation of two or more kinds of crystals among the $SiO_2$—$Al_2O_3$—RO-based crystal, the $SiO_2$-based crystal, and the $SiO_2$—$Al_2O_3$-based crystal when being retained in a temperature range of from the liquidus temperature to (liquidus temperature−50° C.) for 24 hours. It is more preferred that the glass of the present invention have a property of allowing precipitation of the three kinds of crystals in the temperature range. In addition, when two kinds of crystals are allowed to precipitate, it is preferred to adjust the glass composition so as to allow precipitation of the $SiO_2$—$Al_2O_3$—RO-based crystal and the $SiO_2$-based crystal. In the vicinity of a region in which a plurality of crystal phases are in equilibrium with a liquid, the glass is stabilized, and the liquidus temperature significantly lowers.

A $SiO_2$—$Al_2O_3$—CaO-based crystal, particularly anorthite, is preferred as the $SiO_2$—$Al_2O_3$—RO-based crystal. Cristobalite is preferred as the $SiO_2$-based crystal. Mullite is preferred as the $SiO_2$—$Al_2O_3$-based crystal. When the glass allows precipitation of a plurality of those crystals around the liquidus temperature, the liquidus temperature significantly lowers.

The glass of the present invention preferably has the following characteristics.

In recent years, there is an increasing demand for achievement of a reduction in weight in a flat panel display for a mobile application, such as an OLED display or a liquid crystal display. Along with this, there is also a demand for achievement of a reduction in weight in a glass substrate. In order to satisfy such demand, the glass substrate is desirably reduced in density. The density is preferably 2.70 g/cm³ or less or 2.69 g/cm³ or less, particularly preferably 2.68 g/cm³ or less. In contrast, when the density is too low, a component balance of the glass composition may be impaired. As a result, the melting temperature is liable to increase, the liquidus viscosity is liable to lower, and productivity of the glass substrate is liable to lower. In addition, the strain point is liable to lower. Therefore, the density is preferably 2.48 g/cm³ or more or 2.49 g/cm³ or more, particularly preferably 2.50 g/cm³ or more.

The thermal expansion coefficient is preferably from $28\times10^{-7}$/C to $45\times10^{-7}$/C, from $31\times10^{-7}$/C to $44\times10^{-7}$/C, or from $33\times10^{-7}$/C to $43\times10^{-7}$/C, particularly preferably from $36\times10^{-7}$/C to $42\times10^{-7}$/C. Such thermal expansion coefficient easily matches that of a film member to be formed on the glass substrate (for example, of a-Si or p-Si). Herein, the "thermal expansion coefficient" refers to an average thermal expansion coefficient measured in the temperature range of from 30° C. to 380° C., and may be measured with, for example, a dilatometer.

In an OLED display, a liquid crystal display, or the like, a glass substrate having a large area (for example, 730 mm×920 mm or more or 1,100 mm×1,250 mm or more, particularly 1,500 mm×1,500 mm or more) and a glass substrate having a small thickness (for example, a thickness of 0.5 mm or less or 0.4 mm or less, particularly 0.3 mm or less) tend to be used. In such use of the glass substrate having a large area or a small thickness, there arises a significant problem of deflection due to its own weight. In order to reduce the deflection of a glass substrate, the specific Young's modulus of the glass substrate is required to be increased. The specific Young's modulus is preferably 30 GPa/g·cm³ or more, 30.5 GPa/g·cm³ or more, or 31 GPa/g·cm³ or more, particularly preferably 31.5 GPa/g·cm³ or more. In addition, in such use of the glass substrate having a large area or a small thickness, there arises a problem of warpage of the glass substrate after a heat treatment step on a surface plate or a step of forming various metal films, oxide films, semiconductor films, organic films, and the like. In order to reduce the warpage of a glass substrate, it is effective to increase the Young's modulus of the glass substrate. The Young's modulus is preferably 73 GPa or more, 75 GPa or more, or 78 GPa or more, particularly preferably 80 GPa or more.

At present, a LTPS to be used for an ultra-high-definition mobile display offers a step at a temperature of from about 400° C. to about 600° C. In order to suppress thermal shrinkage at such temperature in the step, the strain point is preferably 710° C. or more, 720° C. or more, 730° C. or more, or 740° C. or more, particularly preferably from 750° C. to 790° C.

Recently, an OLED display has been used for a mobile application, a TV application, or the like. As a drive TFT element for those applications, an oxide TFT has attracted attention, in addition to the LTPS. The oxide TFT has hitherto been produced through a process at a temperature of from 300° C. to 400° C., which is comparable to that in the case of a-Si. However, it has been revealed that, when annealing is performed at a heat treatment temperature higher than the conventionally employed temperature, more stable element characteristics can be obtained. Such heat treatment temperature is from about 400° C. to about 600° C., and hence a glass substrate exhibiting less thermal shrinkage has been demanded also in this application.

In the glass of the present invention, the thermal shrinkage ratio obtained by elevating the temperature from 25° C. up to 500° C. at a rate of 5° C./min, keeping the temperature at 500° C. for 1 hour, and dropping the temperature to 25° C. at a rate of 5° C./min is preferably 30 ppm or less, 25 ppm or less, 20 ppm or less, or 15 ppm or less, particularly preferably 10 ppm or less. With such thermal shrinkage ratio, failures, such as a pixel pitch shift, do not easily occur even when thermal treatment is applied in manufacturing steps for a LTPS. When the thermal shrinkage ratio is too small, the productivity of the glass substrate is liable to lower. Therefore, the thermal shrinkage ratio is preferably 5 ppm or more, particularly preferably 8 ppm or more. The thermal shrinkage ratio can be reduced by reducing a cooling speed in forming, as well as by increasing the strain point.

In an overflow down-draw method, molten glass flows down along the surfaces of a wedge-shaped refractory (or a refractory coated with a platinum group metal), and the molten glasses are joined at the lower end of the wedge-shaped refractory to be formed into a sheet shape. In a slot down-draw method, for example, molten glass in a ribbon shape is allowed to flow down from a pipe made of a platinum group metal having a slit-shaped opening, and then cooled to be formed into a sheet shape. When the temperature of the molten glass brought into contact with a forming device is too high, the forming device ages, and the productivity of the glass substrate is liable to lower. Therefore, the temperature at a viscosity at high temperature of $10^{5.0}$ dPa·s is preferably 1,350° C. or less or 1,340° C. or less, particularly preferably 1,330° C. or less. Herein, the "temperature at $10^{5.0}$ dPa·s" may be measured by, for example, a platinum sphere pull up method. The temperature at a viscosity at high temperature of $10^{5.0}$ dPa·s corresponds to the temperature of molten glass at the time of forming.

A low-alkali glass containing $SiO_2$, $Al_2O_3$, $B_2O_3$, and ROs in the glass composition is generally hard to melt. Therefore, the enhancement of the meltability is an issue. When the meltability is enhanced, a defective rate attributed to bubbles, foreign matter, or the like is reduced, and hence a high-quality glass substrate can be supplied at low cost in a large number. In contrast, when the viscosity of the glass in a high-temperature region is too high, removal of bubbles is less promoted in a melting step. Therefore, the temperature at a viscosity at high temperature of $10^{2.5}$ dPa·s is preferably 1,750° C. or less, 1,700° C. or less, or 1,690° C. or less, particularly preferably 1,680° C. or less. Herein, the "temperature at $10^{2.5}$ dPa·s" may be measured by, for example, a platinum sphere pull up method. The temperature at a viscosity at high temperature of $10^{2.5}$ dPa·s corresponds to a melting temperature. As the temperature becomes lower, the meltability becomes more excellent.

When the forming is performed by a down-draw method or the like, the devitrification resistance is important. In consideration of the forming temperature of the low-alkali glass containing $SiO_2$, $Al_2O_3$, $B_2O_3$, and ROs in the glass composition, the liquidus temperature is preferably less than 1,350° C., 1,300° C. or less, 1,260° C. or less, or 1,230° C. or less, particularly preferably 1,200° C. or less. In addition, the liquidus viscosity is preferably $10^{5.0}$ dPa·s or more, $10^{5.2}$ dPa·s or more, $10^{5.3}$ dPa·s or more, $10^{5.4}$ dPa·s or more, or $10^{5.5}$ dPa·s or more, particularly preferably $10^{5.6}$ dPa·s or more. The "liquidus viscosity" refers to the viscosity of glass at a liquidus temperature and may be measured by, for example, a platinum sphere pull up method.

The etching depth obtained through immersion in a 10 mass % HF aqueous solution at 20° C. for 30 minutes is preferably 25 µm or more, 27 µm or more, from 28 µm to 50 µm, or from 29 µm to 45 µm, particularly preferably from 30 µm to 40 µm. The etching depth serves as an indicator of an etching rate in the HF-based chemical. Specifically, a large etching depth indicates a high etching rate in the HF-based chemical, and a small etching depth indicates a low etching rate in the HF-based chemical.

When a β-OH value is reduced, the strain point and bubble quality can be increased without changing the glass composition. The β-OH value is preferably less than 0.40/mm, 0.35/mm or less, 0.3/mm or less, 0.25/mm or less, or 0.2/mm or less, particularly preferably 0.15/mm or less. When the β-OH value is too large, the strain point and the bubble quality are liable to lower. When the β-OH value is too small, the meltability is liable to lower. Therefore, the β-OH value is preferably 0.01/mm or more, particularly preferably 0.05/mm or more. The "β-OH value" refers to a value calculated by using the following equation 1 after measuring the transmittances with an FT-IR.

$$\beta\text{-OH value} = (1/X)\log(T_1/T_2) \quad [\text{Equation 1}]$$

X: Thickness (mm)

$T_1$: Transmittance (%) at a reference wavelength of 3,846 $cm^{-1}$ $T_2$: Minimum transmittance (%) at a wavelength around a hydroxyl group absorption wavelength of 3,600 $cm^{-1}$ A method of reducing the β-OH value is exemplified by the following methods: (1) a method involving selecting raw materials having low water contents; (2) a method involving adding a drying agent, such as Cl or $SO_3$, into a glass batch; (3) a method involving reducing the water content in a furnace atmosphere; (4) a method involving performing $N_2$ bubbling in the molten glass; (5) a method involving adopting a small melting furnace; (6) a method involving increasing the flow rate of the molten glass; and (7) a method involving heating through application of a current with a heating electrode.

Of those, a method of melting a blended glass batch by heating through application of a current with a heating electrode without heating with combustion burner flame is effective for reducing the β-OH value.

The glass of the present invention preferably has a formed joined surface on the center portion in the thickness direction. That is, the glass of the present invention is preferably formed by an overflow down-draw method. The overflow down-draw method refers to a method in which molten glass is caused to overflow from both sides of a wedge-shaped refractory, and the overflowing molten glasses are subjected to down-draw downward at the lower end of the wedge-shaped refractory while being joined, to thereby form a glass substrate. When a glass substrate is produced by the overflow down-draw method, surfaces that are to serve as the surfaces of the glass substrate are formed in a state of free surfaces without being brought into contact with the refractory. As a result, it is possible to produce a glass substrate having good surface quality without polishing at low cost and an increase in area and a reduction in thickness are easily achieved as well.

It is also possible to form a glass substrate by, for example, a down-draw method (such as a slot down method or a redraw method), a float method, and the like, besides the overflow down-draw method.

The thickness of the glass of the present invention is not particularly limited, but is preferably 0.5 mm or less, 0.4 mm or less, or 0.35 mm or less, particularly preferably 0.3 mm or less. As the thickness becomes smaller, the weight of a device can be reduced more easily. In contrast, as the thickness becomes smaller, the glass substrate is more liable to be deflected. However, because the glass of the present invention has a high Young's modulus and a high specific Young's modulus, failures attributed to deflection do not easily occur. The thickness may be adjusted by controlling, for example, the flow rate and the sheet-drawing speed at the time of glass production.

EXAMPLES

The present invention is hereinafter described in detail by way of Examples. However, Examples below are merely examples, and the present invention is by no means limited to Examples below.

Examples of the present invention (Sample Nos. 1 to 23 and 28 to 45) and Comparative Examples (Sample Nos. 24 to 27) are shown in Tables 1 to 4.

TABLE 1

|  |  | No. 1 | No. 2 | No. 3 | No. 4 | No. 5 | No. 6 | No. 7 |
|---|---|---|---|---|---|---|---|---|
| Glass composition (mass %) | SiO$_2$ | 56.1 | 55.6 | 55.0 | 53.3 | 56.1 | 55.0 | 55.0 |
|  | Al$_2$O$_3$ | 18.9 | 20.0 | 20.0 | 19.7 | 18.9 | 20.0 | 22.0 |
|  | B$_2$O$_3$ | 0.3 | 0.3 | 0.3 | 0.3 | 0.3 | 0.3 | 0.3 |
|  | MgO | 1.8 | 2.4 | 3.1 | 3.4 | 1.8 | 3.1 | 3.1 |
|  | CaO | 5.9 | 5.9 | 4.3 | 4.7 | 5.9 | 4.3 | 4.3 |
|  | SrO | 0.8 | 0.8 | 0.8 | 0.9 | 0.8 | 0.8 | 0.8 |
|  | BaO | 10.0 | 8.8 | 10.3 | 11.5 | 10.0 | 10.3 | 10.3 |
|  | P$_2$O$_5$ | 6.0 | 6.0 | 6.0 | 6.0 | 6.0 | 6.0 | 4.0 |
|  | ZrO$_2$ | 0.010 | 0.010 | 0.010 | 0.010 | 0.020 | 0.030 | 0.010 |
|  | TiO$_2$ | 0.005 | 0.005 | 0.010 | 0.020 | 0.010 | 0.010 | 0.005 |
|  | SnO$_2$ | 0.200 | 0.200 | 0.200 | 0.200 | 0.200 | 0.200 | 0.200 |
|  | Fe$_2$O$_3$ | 0.007 | 0.009 | 0.009 | 0.009 | 0.009 | 0.008 | 0.006 |
|  | Cr$_2$O$_3$ | 0.0001 | 0.0001 | 0.0002 | 0.0001 | 0.0001 | 0.0002 | 0.0001 |
|  | Rh$_2$O$_3$ | 0.00005 | 0.00005 | 0.00010 | 0.00005 | 0.00005 | 0.00003 | 0.00005 |
|  | SO$_3$ | 0.0002 | 0.0003 | 0.0003 | 0.0002 | 0.0001 | 0.0002 | 0.0001 |
| 2*[SiO$_2$]—[MgO]—[CaO]—[SrO]—[BaO] (mol %) | | 118.3 | 115.8 | 115.5 | 110.5 | 118.3 | 115.5 | 115.1 |
| [B$_2$O$_3$] + 3*[P$_2$O$_5$] (mol %) | | 9.4 | 9.4 | 9.4 | 9.5 | 9.4 | 9.4 | 6.4 |
| Molar ratio | RO/Al$_2$O$_3$ | 1.202 | 1.172 | 1.162 | 1.297 | 1.202 | 1.162 | 1.056 |
| Mass ratio | (SiO$_2$ + B$_2$O$_3$)/Al$_2$O$_3$ | 2.984 | 2.795 | 2.765 | 2.721 | 2.984 | 2.765 | 2.514 |
| Mass ratio | B$_2$O$_3$/P$_2$O$_5$ | 0.050 | 0.050 | 0.050 | 0.050 | 0.050 | 0.050 | 0.074 |
| β-OH value (/mm) | | 0.15 | 0.16 | 0.17 | 0.21 | 0.20 | 0.15 | 0.15 |
| Density (g/cm$^3$) | | 2.627 | 2.62 | 2.64 | 2.68 | 2.61 | 2.66 | 2.65 |
| Thermal expansion coefficient [30° C.-380° C.] (×10$^{-7}$/° C.) | | 41 | 40 | 39 | 42 | 41 | 39 | 39 |
| Young's modulus (GPa) | | 79 | 80 | 80 | 81 | 78 | 83 | 82 |
| Specific Young's modulus (GPa/g · cm$^{-3}$) | | 30 | 31 | 30 | 30 | 30 | 31 | 31 |
| Strain point (° C.) | | 746 | 746 | 745 | 735 | 748 | 757 | 748 |
| Softening point (° C.) | | 1,041 | 1,035 | 1,035 | 1,018 | 1,041 | 1,039 | 1,032 |
| Temperature at 10$^{2.5}$ dPa · s (° C.) | | 1,640 | 1,613 | 1,614 | 1,582 | 1,638 | 1,596 | 1,592 |
| Liquidus temperature (° C.) | | 1,233 | 1,230 | 1,211 | 1,161 | 1,229 | 1,236 | 1,216 |
| Primary phase | | Cri | Cri | Cri | Cri, Ano | Cri | Mul, Cri | Mul, Cri |
| Liquidus viscosity logη (dPa · s) | | 5.3 | 5.1 | 5.3 | 5.6 | 5.2 | 5.0 | 5.1 |
| Etching depth (μm) | 10% HF at 20° C. for 30 min | 34 | 35 | 35 | 37 | 34 | 39 | 39 |
| HCl resistance | 10% HCl at 80° C. for 3 hr | ○ | ○ | ○ | ○ | ○ | ○ | ○ |

|  |  | No. 8 | No. 9 | No. 10 | No. 11 | No. 12 | No. 13 | No. 14 |
|---|---|---|---|---|---|---|---|---|
| Glass composition (mass %) | SiO$_2$ | 53.0 | 53.0 | 54.0 | 54.0 | 52.0 | 54.0 | 56.1 |
|  | Al$_2$O$_3$ | 22.0 | 20.0 | 25.0 | 23.0 | 25.0 | 25.0 | 20.9 |
|  | B$_2$O$_3$ | 0.3 | 0.3 | 0.3 | 0.3 | 0.3 | 0.3 | 0.3 |
|  | MgO | 3.1 | 3.1 | 1.7 | 1.7 | 1.7 | 1.7 | 1.8 |
|  | CaO | 4.3 | 4.3 | 3.5 | 3.5 | 3.5 | 3.5 | 5.9 |
|  | SrO | 0.8 | 0.8 | 1.3 | 1.3 | 1.3 | 1.3 | 0.8 |
|  | BaO | 10.3 | 10.3 | 6.0 | 6.0 | 6.0 | 6.0 | 10.0 |
|  | P$_2$O$_5$ | 6.0 | 8.0 | 8.0 | 10.0 | 10.0 | 8.0 | 4.0 |
|  | ZrO$_2$ | 0.010 | 0.010 | 0.010 | 0.010 | 0.010 | 0.010 | 0.015 |
|  | TiO$_2$ | 0.005 | 0.005 | 0.005 | 0.005 | 0.005 | 0.005 | 0.010 |
|  | SnO$_2$ | 0.200 | 0.200 | 0.200 | 0.200 | 0.200 | 0.200 | 0.200 |
|  | Fe$_2$O$_3$ | 0.007 | 0.008 | 0.007 | 0.008 | 0.007 | 0.007 | 0.007 |
|  | Cr$_2$O$_3$ | 0.0001 | 0.0001 | 0.0001 | 0.0001 | 0.0001 | 0.0001 | 0.0001 |
|  | Rh$_2$O$_3$ | 0.00005 | 0.00006 | 0.00005 | 0.00006 | 0.00005 | 0.00005 | 0.00005 |
|  | SO$_3$ | 0.0001 | 0.0003 | 0.0001 | 0.0003 | 0.0002 | 0.0003 | 0.0001 |
| 2*[SiO$_2$]—[MgO]—[CaO]—[SrO]—[BaO] (mol %) | | 111.8 | 112.3 | 120.5 | 121.0 | 117.2 | 120.5 | 117.9 |
| [B$_2$O$_3$] + 3*[P$_2$O$_5$] (mol %) | | 9.5 | 12.7 | 12.7 | 15.9 | 16.1 | 12.7 | 6.4 |
| Molar ratio | RO/Al$_2$O$_3$ | 1.056 | 1.162 | 0.637 | 0.693 | 0.637 | 0.637 | 1.087 |
| Mass ratio | (SiO$_2$ + B$_2$O$_3$)/Al$_2$O$_3$ | 2.423 | 2.665 | 2.172 | 2.361 | 2.092 | 2.172 | 2.699 |
| Mass ratio | B$_2$O$_3$/P$_2$O$_5$ | 0.050 | 0.037 | 0.038 | 0.030 | 0.030 | 0.038 | 0.075 |
| β-OH value (/mm) | | 0.20 | 0.20 | 0.19 | 0.20 | 0.15 | 0.15 | 0.15 |
| Density (g/cm$^3$) | | 2.63 | 2.65 | 2.54 | 2.52 | 2.54 | 2.55 | 2.63 |
| Thermal expansion coefficient [30° C.-380° C.] (×10$^{-7}$/° C.) | | 40 | 41 | 31 | 31 | 31 | 31 | 40 |
| Young's modulus (GPa) | | 78 | 80 | 81 | 78 | 80 | 81 | 81 |
| Specific Young's modulus (GPa/g · cm$^{-3}$) | | 30 | 30 | 32 | 31 | 31 | 32 | 31 |
| Strain point (° C.) | | 736 | 740 | 776 | 770 | 771 | 778 | 763 |
| Softening point (° C.) | | 1,029 | 1,026 | 1,070 | 1,076 | 1,067 | 1,070 | 1,046 |

TABLE 1-continued

|  |  |  |  |  |  |  |  |  |
|---|---|---|---|---|---|---|---|---|
| Temperature at $10^{2.5}$ dPa·s (° C.) |  | 1,601 | 1,583 | 1,634 | 1,663 | 1,633 | 1,637 | 1,627 |
| Liquidus temperature (° C.) |  | 1,250 | 1,178 | — | — | — | — | — |
| Primary phase |  | Cri | Cri, Mul | — | — | — | — | — |
| Liquidus viscosity log η (dPa·s) |  | 4.8 | 5.5 | — | — | — | — | — |
| Etching depth (μm) | 10% HF at 20° C. for 30 min | 38 | 39 | 40 | 33 | 40 | 40 | 35 |
| HCl resistance | 10% HCl at 80° C. for 3 hr | ○ | ○ | ○ | ○ | ○ | ○ | ○ |

TABLE 2

|  |  | No. 15 | No. 16 | No. 17 | No. 18 | No. 19 | No. 20 | No. 21 |
|---|---|---|---|---|---|---|---|---|
| Glass composition (mass %) | $SiO_2$ | 59.6 | 60.1 | 59.2 | 61.2 | 60.2 | 55.2 | 58.6 |
|  | $Al_2O_3$ | 16.8 | 17.3 | 16.8 | 18.8 | 19.0 | 18.2 | 19.1 |
|  | $B_2O_3$ | 3.0 | 1.5 | 1.5 | 1.3 | 0.0 | 2.4 | 2.5 |
|  | MgO | 2.3 | 1.7 | 0.6 | 1.7 | 1.7 | 0.8 | 1.1 |
|  | CaO | 3.6 | 3.2 | 5.1 | 4.4 | 5.6 | 3.4 | 3.1 |
|  | SrO | 3.0 | 3.7 | 2.2 | 3.7 | 3.7 | 3.5 | 5.1 |
|  | BaO | 5.5 | 6.5 | 6.4 | 6.6 | 5.5 | 10.4 | 4.3 |
|  | $P_2O_5$ | 6.1 | 6.0 | 8.1 | 2.0 | 4.1 | 5.9 | 6.0 |
|  | $ZrO_2$ | 0.010 | 0.030 | 0.010 | 0.010 | 0.010 | 0.010 | 0.010 |
|  | $TiO_2$ | 0.010 | 0.010 | 0.005 | 0.005 | 0.005 | 0.005 | 0.005 |
|  | $SnO_2$ | 0.200 | 0.200 | 0.200 | 0.200 | 0.200 | 0.200 | 0.200 |
|  | $Fe_2O_3$ | 0.009 | 0.008 | 0.006 | 0.008 | 0.007 | 0.009 | 0.009 |
|  | $Cr_2O_3$ | 0.0002 | 0.0002 | 0.0001 | 0.0001 | 0.0001 | 0.0001 | 0.0001 |
|  | $Rh_2O_3$ | 0.00005 | 0.00003 | 0.00005 | 0.00006 | 0.00005 | 0.00005 | 0.00005 |
|  | $SO_3$ | 0.0002 | 0.0002 | 0.0001 | 0.0003 | 0.0003 | 0.0003 | 0.0003 |
| 2*[$SiO_2$]−[MgO]−[CaO]−[SrO]−[BaO] (mol %) |  | 125.8 | 129.3 | 129.1 | 127.6 | 124.9 | 121.9 | 127.4 |
| [$B_2O_3$] + 3*[$P_2O_5$] (mol %) |  | 12.0 | 10.5 | 13.7 | 4.3 | 6.0 | 11.6 | 11.6 |
| Molar ratio | RO/$Al_2O_3$ | 1.130 | 1.042 | 1.016 | 1.093 | 1.156 | 1.026 | 0.862 |
| Mass ratio | ($SiO_2$ + $B_2O_3$)/$Al_2O_3$ | 3.735 | 3.568 | 3.606 | 3.328 | 3.175 | 3.163 | 3.203 |
| Mass ratio | $B_2O_3$/$P_2O_5$ | 0.490 | 0.245 | 0.181 | 0.646 | 0.000 | 0.403 | 0.425 |
| β-OH value (/mm) |  | 0.15 | 0.15 | 0.16 | 0.20 | 0.20 | 0.19 | 0.20 |
| Density (g/cm³) |  | 2.51 | 2.54 | 2.51 | 2.58 | 2.58 | 2.61 | 2.52 |
| Thermal expansion coefficient [30° C.-380° C.] ($\times 10^{-7}$/° C.) |  | 35 | 35 | 35 | 37 | 38 | 38 | 34 |
| Young's modulus (GPa) |  | 75 | 75 | 73 | 80 | 80 | 75 | 75 |
| Specific Young's modulus (GPa/g·cm⁻³) |  | 30 | 30 | 29 | 31 | 31 | 29 | 30 |
| Strain point (° C.) |  | 718 | 750 | 749 | 759 | 771 | 732 | 752 |
| Softening point (° C.) |  | 1,040 | 1,070 | 1,076 | 1,054 | 1,058 | 1,051 | 1,069 |
| Temperature at $10^{2.5}$ dPa·s (° C.) |  | 1,691 | 1,726 | 1,742 | 1,674 | 1,666 | 1,689 | 1,708 |
| Liquidus temperature (° C.) |  | — | — | — | — | — | — | — |
| Primary phase |  | — | — | — | — | — | — | — |
| Liquidus viscosity log η (dPa·s) |  | — | — | — | — | — | — | — |
| Etching depth (μm) | 10% HF at 20° C. for 30 min | 30 | 28 | 28 | 29 | 30 | 32 | 29 |
| HCl resistance | 10% HCl at 80° C. for 3 hr | ○ | ○ | ○ | ○ | ○ | ○ | ○ |

|  |  | No. 22 | No. 23 | No. 24 | No. 25 | No. 26 | No. 27 | No. 28 |
|---|---|---|---|---|---|---|---|---|
| Glass composition (mass %) | $SiO_2$ | 57.8 | 60.5 | 53.2 | 50.9 | 53.2 | 48.8 | 60.5 |
|  | $Al_2O_3$ | 20.3 | 19.5 | 18.6 | 17.8 | 18.6 | 17.1 | 19.5 |
|  | $B_2O_3$ | 2.9 | 2.5 | 3.2 | 3.0 | 7.7 | 11.3 | 1.5 |
|  | MgO | 1.1 | 1.0 | 0.9 | 0.9 | 0.9 | 0.8 | 1.0 |
|  | CaO | 3.1 | 7.0 | 6.4 | 6.1 | 6.4 | 5.8 | 7.0 |
|  | SrO | 2.2 | 2.5 | 2.3 | 2.2 | 2.3 | 2.1 | 2.5 |
|  | BaO | 6.4 | 4.8 | 3.5 | 3.3 | 3.5 | 3.2 | 5.8 |
|  | $P_2O_5$ | 5.9 | 2.0 | 11.8 | 15.7 | 7.3 | 10.8 | 2.0 |
|  | $ZrO_2$ | 0.010 | 0.010 | 0.020 | 0.015 | 0.010 | 0.020 | 0.010 |
|  | $TiO_2$ | 0.010 | 0.020 | 0.010 | 0.010 | 0.010 | 0.010 | 0.005 |
|  | $SnO_2$ | 0.200 | 0.200 | 0.200 | 0.200 | 0.200 | 0.200 | 0.200 |
|  | $Fe_2O_3$ | 0.009 | 0.009 | 0.009 | 0.007 | 0.009 | 0.009 | 0.007 |
|  | $Cr_2O_3$ | 0.0002 | 0.0001 | 0.0001 | 0.0001 | 0.0002 | 0.0001 | 0.0001 |
|  | $Rh_2O_3$ | 0.00010 | 0.00005 | 0.00005 | 0.00005 | 0.00010 | 0.00005 | 0.00005 |
|  | $SO_3$ | 0.0003 | 0.0002 | 0.0001 | 0.0001 | 0.0003 | 0.0001 | 0.0002 |

TABLE 2-continued

| | | | | | | | | |
|---|---|---|---|---|---|---|---|---|
| 2* [SiO₂]—[MgO]—[CaO]—[SrO]—[BaO] (mol %) | | 127.7 | 124.3 | 115.3 | 112.7 | 112.6 | 105.3 | 124.6 |
| [B₂O₃] + 3* [P₂O₅] (mol %) | | 12.0 | 5.4 | 21.4 | 27.8 | 18.7 | 28.2 | 2.9 |
| Molar ratio RO/Al₂O₃ | | 0.734 | 1.072 | 0.987 | 0.987 | 0.987 | 0.987 | 1.106 |
| Mass ratio (SiO₂ + B₂O₃)/Al₂O₃ | | 2.992 | 3.231 | 3.024 | 3.024 | 3.268 | 3.512 | 3.179 |
| Mass ratio B₂O₃/P₂O₅ | | 0.490 | 1.250 | 0.269 | 0.194 | 1.063 | 1.038 | 0.750 |
| β-OH value (/mm) | | 0.20 | 0.20 | 0.20 | 0.21 | 0.21 | 0.21 | 0.13 |
| Density (g/cm³) | | 2.52 | 2.55 | 2.48 | 2.46 | 2.47 | 2.41 | 2.54 |
| Thermal expansion coefficient [30° C.-380° C.] (×10⁻⁷/° C.) | | 32 | 38 | 37 | 38 | 37 | 37 | 36 |
| Young's modulus (GPa) | | 75 | 79 | 72 | 70 | 71 | 64 | 80 |
| Specific Young's modulus (GPa/g · cm⁻³) | | 30 | 31 | 29 | 28 | 29 | 27 | 32 |
| Strain point (° C.) | | 755 | 739 | 700 | 699 | 670 | 641 | 761 |
| Softening point (° C.) | | 1,079 | 1,036 | 1,013 | — | 969 | — | 1,060 |
| Temperature at 10^2.5 dPa · s (° C.) | | 1,713 | 1,639 | 1,626 | 1,633 | 1,550 | 1,524 | 1,677 |
| Liquidus temperature (° C.) | | — | 1,223 | — | — | — | — | 1,267 |
| Primary phase | | — | Ano | — | — | — | — | Cri, Ano |
| Liquidus viscosity logη (dPa · s) | | — | 5.2 | — | — | — | — | 5.0 |
| Etching depth (μm) | 10% HF at 20° C. for 30 min | 29 | 31 | — | — | — | — | 33 |
| HCl resistance | 10% HCl at 80° C. for 3 hr | ○ | ○ | Δ | x | Δ | x | ○ |

TABLE 3

| | | No. 29 | No. 30 | No. 31 | No. 32 | No. 33 | No. 34 | No. 35 |
|---|---|---|---|---|---|---|---|---|
| Glass composition (mass %) | SiO₂ | 55.0 | 60.0 | 57.6 | 57.0 | 56.1 | 56.9 | 57.7 |
| | Al₂O₃ | 21.5 | 19.8 | 21.0 | 20.0 | 21.1 | 21.4 | 21.7 |
| | B₂O₃ | 0.3 | 1.6 | 0.3 | 0.3 | 0.3 | 0.3 | 0.3 |
| | MgO | 3.1 | 2.5 | 2.5 | 3.0 | 3.1 | 3.2 | 3.2 |
| | CaO | 4.3 | 4.6 | 4.6 | 4.5 | 4.7 | 5.6 | 6.5 |
| | SrO | 0.8 | 1.8 | 1.8 | 3.0 | 0.7 | 0.7 | 0.7 |
| | BaO | 8.8 | 8.0 | 8.0 | 8.0 | 9.7 | 7.7 | 5.5 |
| | P₂O₅ | 6.0 | 1.5 | 4.0 | 4.0 | 4.0 | 4.0 | 4.1 |
| | ZrO₂ | 0.010 | 0.010 | 0.010 | 0.020 | 0.030 | 0.010 | 0.010 |
| | TiO₂ | 0.005 | 0.010 | 0.020 | 0.010 | 0.010 | 0.005 | 0.005 |
| | SnO₂ | 0.200 | 0.200 | 0.200 | 0.200 | 0.200 | 0.200 | 0.200 |
| | Fe₂O₃ | 0.009 | 0.009 | 0.009 | 0.009 | 0.008 | 0.006 | 0.007 |
| | Cr₂O₃ | 0.0001 | 0.0002 | 0.0001 | 0.0001 | 0.0002 | 0.0001 | 0.0001 |
| | Rh₂O₃ | 0.00005 | 0.00010 | 0.00005 | 0.00005 | 0.00003 | 0.00005 | 0.00005 |
| | SO₃ | 0.0003 | 0.0003 | 0.0002 | 0.0001 | 0.0002 | 0.0001 | 0.0001 |
| | Li₂O | 0.0010 | 0.0007 | 0.0010 | 0.0015 | 0.0012 | 0.0012 | 0.0007 |
| | Na₂O | 0.0200 | 0.0150 | 0.0170 | 0.0100 | 0.0220 | 0.0150 | 0.0150 |
| | K₂O | 0.0032 | 0.0040 | 0.0025 | 0.0048 | 0.0034 | 0.0034 | 0.0040 |
| 2* [SiO₂]—[MgO]—[CaO]—[SrO]—[BaO] (mol %) | | 115.7 | 123.7 | 120.7 | 117.5 | 116.3 | 116.3 | 116.3 |
| [B₂O₃] + 3* [P₂O₅] (mol %) | | 9.4 | 3.8 | 6.3 | 6.3 | 6.3 | 6.3 | 6.3 |
| Molar ratio RO/Al₂O₃ | | 1.037 | 1.100 | 1.037 | 1.202 | 1.122 | 1.122 | 1.122 |
| Mass ratio (SiO₂ + B₂O₃)/Al₂O₃ | | 2.572 | 3.111 | 2.757 | 2.865 | 2.676 | 2.676 | 2.676 |
| Mass ratio B₂O₃/P₂O₅ | | 0.050 | 1.067 | 0.075 | 0.074 | 0.074 | 0.074 | 0.074 |
| β-OH value (/mm) | | 0.15 | 0.15 | 0.15 | 0.10 | 0.09 | 0.10 | 0.10 |
| Density (g/cm³) | | 2.613 | 2.600 | 2.612 | 2.637 | 2.639 | 2.613 | 2.585 |
| Thermal expansion coefficient [30° C.-380° C.] (×10⁻⁷/° C.) | | 38 | 38 | 38 | 40 | 40 | 39 | 38 |
| Young's modulus (GPa) | | 81 | 82 | 82 | 82 | 82 | 83 | 84 |
| Specific Young's modulus (GPa/g · cm⁻³) | | 31.2 | 31.4 | 31.5 | 31.2 | 31.3 | 31.8 | 32.4 |
| Strain point (° C.) | | 746 | 742 | 757 | 748 | 751 | 752 | 753 |
| Softening point (° C.) | | 1,038 | 1,041 | 1,050 | 1,037 | 1,037 | 1,035 | 1,033 |
| Temperature at 10^2.5 dPa · s (° C.) | | 1,609 | 1,630 | 1,633 | 1,616 | 1,605 | 1,598 | 1,592 |
| Liquidus temperature (° C.) | | 1,226 | 1,176 | 1,217 | 1,281 | 1,210 | 1,199 | 1,211 |
| Primary phase | | Mul, Cri | Ano, Cri | Mul, Cri | Cri, Ano | Ano, Mul | Ano, Cri | Ano, Cri |
| Liquidus viscosity logη (dPa · s) | | 5.1 | 5.8 | 5.4 | 5.3 | 5.3 | 5.3 | 5.2 |
| Etching depth (μm) | 10% HF at 20° C. for 30 min | 46 | 34 | 40 | 41 | 43 | 41 | 39 |
| HCl resistance | 10% HCl at 80° C. for 3 hr | ○ | ○ | ○ | ○ | ○ | ○ | ○ |

TABLE 3-continued

|  |  | No. 36 | No. 37 | No. 38 | No. 39 | No. 40 | No. 41 | No. 42 |
|---|---|---|---|---|---|---|---|---|
| Glass composition (mass %) | $SiO_2$ | 56.5 | 57.3 | 59.8 | 60.3 | 60.3 | 59.4 | 58.5 |
|  | $Al_2O_3$ | 21.2 | 21.5 | 20.5 | 20.9 | 21.0 | 20.8 | 20.5 |
|  | $B_2O_3$ | 0.3 | 0.3 | 0.3 | 0.3 | 0.3 | 0.3 | 0.3 |
|  | MgO | 3.1 | 3.2 | 2.5 | 2.9 | 3.0 | 2.7 | 2.3 |
|  | CaO | 4.8 | 5.6 | 6.4 | 6.0 | 6.2 | 6.1 | 5.9 |
|  | SrO | 2.2 | 2.2 | 0.7 | 0.2 | 0.5 | 0.4 | 0.3 |
|  | BaO | 7.6 | 5.5 | 6.6 | 6.7 | 6.0 | 7.2 | 8.4 |
|  | $P_2O_5$ | 4.0 | 4.1 | 3.0 | 2.5 | 2.5 | 3.0 | 3.5 |
|  | $ZrO_2$ | 0.010 | 0.010 | 0.010 | 0.010 | 0.010 | 0.015 | 0.010 |
|  | $TiO_2$ | 0.005 | 0.005 | 0.005 | 0.005 | 0.005 | 0.010 | 0.010 |
|  | $SnO_2$ | 0.200 | 0.200 | 0.200 | 0.200 | 0.200 | 0.200 | 0.200 |
|  | $Fe_2O_3$ | 0.008 | 0.007 | 0.008 | 0.007 | 0.007 | 0.007 | 0.009 |
|  | $Cr_2O_3$ | 0.0001 | 0.0001 | 0.0001 | 0.0001 | 0.0001 | 0.0001 | 0.0002 |
|  | $Rh_2O_3$ | 0.00006 | 0.00005 | 0.00006 | 0.00005 | 0.00005 | 0.00005 | 0.00005 |
|  | $SO_3$ | 0.0003 | 0.0001 | 0.0003 | 0.0002 | 0.0003 | 0.0001 | 0.0002 |
|  | $Li_2O$ | 0.0010 | 0.0015 | 0.0008 | 0.0007 | 0.0010 | 0.0015 | 0.0008 |
|  | $Na_2O$ | 0.0170 | 0.0100 | 0.0220 | 0.0150 | 0.0150 | 0.0170 | 0.0160 |
|  | $K_2O$ | 0.0025 | 0.0048 | 0.0034 | 0.0040 | 0.0030 | 0.0025 | 0.0024 |
| 2*[$SiO_2$]—[MgO]—[CaO]—[SrO]—[BaO] (mol %) |  | 116.3 | 116.3 | 121.8 | 122.4 | 121.6 | 121.3 | 121 |
| [$B_2O_3$] + 3* [$P_2O_5$] (mol %) |  | 6.3 | 6.3 | 4.7 | 3.9 | 3.9 | 4.7 | 5.4 |
| Molar ratio | $RO/Al_2O_3$ | 1.122 | 1.122 | 1.098 | 1.092 | 1.112 | 1.107 | 1.102 |
| Mass ratio | $(SiO_2 + B_2O_3)/Al_2O_3$ | 2.676 | 2.676 | 2.932 | 2.894 | 2.885 | 2.877 | 2.869 |
| Mass ratio | $B_2O_3/P_2O_5$ | 0.074 | 0.074 | 0.100 | 0.123 | 0.119 | 0.099 | 0.085 |
| β-OH value (/mm) |  | 0.10 | 0.10 | 0.10 | 0.06 | 0.08 | 0.08 | 0.08 |
| Density (g/cm³) |  | 2.627 | 2.599 | 2.586 | 2.580 | 2.578 | 2.591 | 2.606 |
| Thermal expansion coefficient [30° C.-380° C.] (×$10^{-7}$/° C.) |  | 39 | 39 | 38 | 37 | 37 | 38 | 38 |
| Young's modulus (GPa) |  | 83 | 83 | 83 | 83 | 84 | 83 | 82 |
| Specific Young's modulus (GPa/g · cm⁻³) |  | 31.5 | 32.1 | 32.1 | 32.3 | 32.5 | 31.9 | 31.4 |
| Strain point (° C.) |  | 752 | 752 | 760 | 762 | 758 | 759 | 758 |
| Softening point (° C.) |  | 1,036 | 1,035 | 1,049 | 1,049 | 1,045 | 1,048 | 1,049 |
| Temperature at $10^{2.5}$ dPa · s (° C.) |  | 1,601 | 1,595 | 1,627 | 1,624 | 1,615 | 1,622 | 1,628 |
| Liquidus temperature (° C.) |  | 1,191 | 1,205 | 1,223 | 1,231 | 1,235 | 1,230 | 1,222 |
| Primary phase |  | Ano, Cri | Ano, Cri | Ano, Cri | Cri, Ano | Ano, Cri | Ano, Cri | Ano, Cri |
| Liquidus viscosity log η (dPa · s) |  | 5.4 | 5.3 | 5.3 | 5.2 | 5.1 | 5.2 | 5.3 |
| Etching depth (μm) | 10% HF at 20° C. for 30 min | 42 | 40 | 34 | 33 | 33 | 35 | 37 |
| HCl resistance | 10% HCl at 80° C. for 3 hr | ○ | ○ | ○ | ○ | ○ | ○ | ○ |

TABLE 4

|  |  | No. 43 | No. 44 | No. 45 |
|---|---|---|---|---|
| Glass composition (mass %) | $SiO_2$ | 57.7 | 59.7 | 60.0 |
|  | $Al_2O_3$ | 20.3 | 20.8 | 20.8 |
|  | $B_2O_3$ | 0.3 | 0.3 | 0.3 |
|  | MgO | 2.0 | 2.7 | 2.7 |
|  | CaO | 5.8 | 5.9 | 5.9 |
|  | SrO | 0.2 | 0.1 | 0.2 |
|  | BaO | 9.6 | 7.3 | 7.3 |
|  | $P_2O_5$ | 3.9 | 2.9 | 2.5 |
|  | $ZrO_2$ | 0.030 | 0.010 | 0.010 |
|  | $TiO_2$ | 0.010 | 0.005 | 0.005 |
|  | $SnO_2$ | 0.200 | 0.200 | 0.200 |
|  | $Fe_2O_3$ | 0.008 | 0.006 | 0.008 |
|  | $Cr_2O_3$ | 0.0002 | 0.0001 | 0.0001 |
|  | $Rh_2O_3$ | 0.00003 | 0.00005 | 0.00006 |
|  | $SO_3$ | 0.0002 | 0.0001 | 0.0003 |
|  | $Li_2O$ | 0.0007 | 0.0007 | 0.0010 |
|  | $Na_2O$ | 0.0150 | 0.0130 | 0.0200 |
|  | $K_2O$ | 0.0030 | 0.0022 | 0.0030 |
| 2 * [$SiO_2$] − [MgO] − [CaO] − [SrO] − [BaO] (mol %) |  | 120.7 | 122.0 | 122.4 |
| [$B_2O_3$] + 3 * [$P_2O_5$] (mol %) |  | 6.2 | 4.5 | 3.9 |
| Molar ratio | $RO/Al_2O_3$ | 1.097 | 1.092 | 1.092 |
| Mass ratio | $(SiO_2 + B_2O_3)/Al_2O_3$ | 2.861 | 2.886 | 2.894 |
| Mass ratio | $B_2O_3/P_2O_5$ | 0.075 | 0.105 | 0.123 |
|  | β-OH value (/mm) | 0.07 | 0.10 | 0.10 |
|  | Density (g/cm³) | 2.619 | 2.589 | 2.591 |

TABLE 4-continued

|  | No. 43 | No. 44 | No. 45 |
|---|---|---|---|
| Thermal expansion coefficient [30° C.-380° C.] (×10$^{-7}$/° C.) | 39 | 37 | 38 |
| Young's modulus (GPa) | 81 | 83 | 83 |
| Specific Young's modulus (GPa/g · cm$^{-3}$) | 30.9 | 32.1 | 32.0 |
| Strain point (° C.) | 758 | 757 | 758 |
| Softening point (° C.) | 1,051 | 1,048 | 1,050 |
| Temperature at 10$^{2.5}$ dPa · s (° C.) | 1,636 | 1,626 | 1,624 |
| Liquidus temperature (° C.) | 1,213 | 1,212 | 1,224 |
| Primary phase | Ano, Cri | Ano, Cri | Ano, Cri |
| Liquidus viscosity log η (dPa · s) | 5.4 | 5.4 | 5.3 |
| Etching depth 10% HF at 20° C. for 30 min (μm) | 39 | 35 | 34 |
| HCl resistance 10% HCl at 80° C. for 3 hr | ○ | ○ | ○ |

Each sample was produced in the following manner. First, a glass batch prepared by blending glass raw materials so that each glass composition listed in the tables was attained was placed in a platinum crucible, and then melted at 1,600° C. for 24 hours. When the glass batch was dissolved, molten glass was stirred to be homogenized by using a platinum stirrer. Next, the molten glass was poured on a carbon sheet and formed into a glass having a sheet shape. Each of the resultant samples was evaluated for its β-OH value, density, thermal expansion coefficient, Young's modulus, specific Young's modulus, strain point, softening point, temperature at a viscosity at high temperature of 10$^{2.5}$ dPa·s, liquidus temperature, primary phase, liquidus viscosity, etching depth in a HF aqueous solution, and HCl resistance.

The β-OH value is a value measured by the above-mentioned method.

The density is a value measured by a well-known Archimedes method.

The thermal expansion coefficient is an average thermal expansion coefficient measured in the temperature range of from 30° C. to 380° C. with a dilatometer.

The Young's modulus refers to a value measured by a dynamic elastic modulus measurement method (resonance method) in accordance with JIS R1602, and the specific Young's modulus is a value obtained by dividing the Young's modulus by the density.

The strain point and the softening point are values measured based on the method of ASTM C336.

The temperature at a viscosity at high temperature of 10$^{2.5}$ dPa·s is a value measured by a platinum sphere pull up method.

The liquidus temperature refers to a temperature at which devitrification (crystalline foreign matter) is observed in glass when glass powder which has passed through a standard 30-mesh sieve (500 μm) and remained on a 50-mesh sieve (300 μm) is placed in a platinum boat and kept for 24 hours in a gradient heating furnace set to from 1,100° C. to 1,350° C., followed by taking the platinum boat out of the gradient heating furnace. In addition, a crystal that had precipitated in a temperature range of from the liquidus temperature to (liquidus temperature−50° C.) was evaluated as a primary phase. In the tables, the "Cri" represents cristobalite, the "Ano" represents anorthite, and the "Mul" represents mullite. Further, the viscosity of the glass at the liquidus temperature was measured by a platinum sphere pull up method and was defined as the liquidus viscosity.

The etching depth was evaluated as described below. Both surfaces of each sample were optically polished, and then masking was performed on part of the surface of each sample. Each sample was then immersed in a 10 mass % HF aqueous solution at 20° C. for 30 minutes. After that, an etching depth was evaluated by measuring a difference in surface level between a masked portion and an etched portion on the surface of the resultant sample.

The HCl resistance was evaluated as described below. Both surfaces of each sample were optically polished, and then each sample was immersed in a 10 mass % HCl aqueous solution at 80° C. for 3 hours. After that, the surfaces of each sample were observed, and the case in which the surfaces were transparent was evaluated as "○", the case in which the surfaces were slightly cloudy was evaluated as "Δ", and the case in which white turbidity occurred on the surfaces was evaluated as "x".

As is apparent from Tables 1 to 4, each of Sample Nos. 1 to 23 and 28 to 45 had a thermal expansion coefficient of from 31×10$^{-7}$/° C. to 42×10$^{-7}$/C, a strain point of 718° C. or more, a Young's modulus of 73 GPa or more, a specific Young's modulus of 29 GPa/(g/cm$^3$) or more, a liquidus temperature of 1,250° C. or less, a liquidus viscosity of 10$^{4.8}$ dPa·s or more, and an etching depth of 28 μm or more, and was good in the evaluation of HCl resistance.

Meanwhile, each of Sample Nos. 24 to 27 underwent phase separation because the value {[B$_2$O$_3$]+3×[P$_2$O$_5$]} was too high, and was poorer in the evaluation of HCl resistance than Sample Nos. 1 to 23.

INDUSTRIAL APPLICABILITY

The glass of the present invention has a higher etching rate in a HF-based chemical than the related-art glass, has high devitrification resistance, and besides, has high HCl resistance and a high strain point. Therefore, the glass of the present invention is suitable for a substrate for a display, such as an OLED display or a liquid crystal display, and for a substrate for a display driven by a LTPS TFT or an oxide TFT.

The invention claimed is:

1. A glass, which comprises as a glass composition, in terms of mass %, 50% to 65% of SiO$_2$, 15% to 26% of Al$_2$O$_3$, 0% to 5% of MgO, 0% to 10% of CaO, 0% to 10% of SrO, 0% to 15% of BaO, 0.01% to 15% of P$_2$O$_5$, 0% to 0.1% of ZrO$_2$, and 3% or less of B$_2$O$_3$, has a molar ratio (MgO+CaO+SrO+BaO)/Al$_2$O$_3$ of from 0.5 to 1.5, has a mass ratio (SiO$_2$+B$_2$O$_3$)/Al$_2$O$_3$ of from 2 to 3.735, and satisfies a relationship of 4 mol %≤{[B$_2$O$_3$]+3×[P$_2$O$_5$]}≤18.5 mol %.

2. The glass according to claim 1, wherein the glass has a mass ratio B$_2$O$_3$/P$_2$O$_5$ of 2 or less.

3. The glass according to claim 1, wherein the glass satisfies a relationship of 4 mol % $\leq \{[B_2O_3]+3\times[P_2O_5]\} \leq 16.5$ mol % and a relationship of 110 mol % $\leq \{2\times[SiO_2]-[MgO]-[CaO]-[SrO]-[BaO]\} \leq 130$ mol %.

4. The glass according to claim 1, wherein the glass has a content of $Li_2O+Na_2O+K_2O$ of 0.5 mass % or less in the glass composition.

5. The glass according to claim 1, wherein the glass has a property of allowing precipitation of two or more crystals among a $SiO_2$—$Al_2O_3$—RO-based crystal, a $SiO_2$-based crystal, and a $SiO_2$—$Al_2O_3$-based crystal when being retained in a temperature range of from a liquidus temperature to (liquidus temperature−50° C.) for 24 hours.

6. The glass according to claim 1, wherein the glass has a strain point of 710° C. or more.

7. The glass according to claim 1, wherein the glass has an etching depth of 25 μm or more when immersed in a 10 mass % HF aqueous solution at 20° C. for 30 minutes.

8. The glass according to claim 1, wherein the glass has a specific Young's modulus of 28 $GPa/(g/cm^3)$ or more.

9. The glass according to claim 1, wherein the glass is used for a substrate for a liquid crystal display.

10. The glass according to claim 1, wherein the glass is used for a substrate for an OLED display.

11. The glass according to claim 1, wherein the glass is used for a substrate for a high-definition display driven by a polysilicon or oxide TFT.

\* \* \* \* \*